United States Patent [19]

Walles et al.

[11] Patent Number: 4,853,423
[45] Date of Patent: Aug. 1, 1989

[54] CURABLE POLYPHENYLENE ETHER-POLYEPOXIDE COMPOSITIONS USEFUL IN PRINTED CIRCUIT BOARD PRODUCTION

[75] Inventors: Erik W. Walles, Rensselaer; John H. Lupinski, Scotia; Mark Markovitz, Schenectady; Robert E. Colborn, Schenectady; James R. Presley, Schenectady, all of N.Y.; Michael J. Davis, Coshocton, Ohio; Michael G. Minnick, Coshocton, Ohio; Steven J. Kubisen, Jr., Coshocton, Ohio; John E. Hallgren; Donald A. Bolon, both of Scotia, N.Y.; Victoria J. Eddy; Patricia C. Irwin, both of Schenectady, N.Y.

[73] Assignee: General Electric Company, Schenectady, N.Y.

[21] Appl. No.: 219,106

[22] Filed: Jul. 14, 1988

[51] Int. Cl.$^4$ .................... C08L 61/10; C08L 63/02; C08L 63/04; C08L 71/04
[52] U.S. Cl. .................................. 523/428; 523/429; 525/396
[58] Field of Search ................ 525/396, 524; 523/428, 523/429

[56] References Cited

U.S. PATENT DOCUMENTS

| | | | |
|---|---|---|---|
| 3,367,990 | 2/1968 | Bremmer | 525/524 |
| 3,560,388 | 2/1971 | Higashi | 525/524 |
| 3,780,132 | 12/1973 | Lohr | 525/524 |
| 3,812,214 | 5/1974 | Markovitz | 528/92 |
| 4,242,254 | 12/1980 | Abolins | 524/80 |
| 4,320,222 | 3/1982 | Lopez | 525/524 |
| 4,528,346 | 7/1985 | Sugie et al. | 525/396 |
| 4,593,056 | 6/1986 | Qureshi et al. | 525/524 |
| 4,608,404 | 8/1986 | Gardner et al. | 525/396 |
| 4,656,208 | 4/1987 | Chu et al. | 525/396 |
| 4,661,559 | 4/1987 | Gardner et al. | 525/396 |

FOREIGN PATENT DOCUMENTS

| | | | |
|---|---|---|---|
| 62-72714 | 4/1987 | Japan | 525/396 |
| 5869052 | 10/1988 | Japan | |

Primary Examiner—Lewis T. Jacobs
Assistant Examiner—Robert E. L. Sellers, II
Attorney, Agent, or Firm—William H. Pittman; James C. Davis, Jr.

[57] ABSTRACT

Curable compositions containing a reaction product of at least one bisphenol polyglycidyl ether, at least one epoxidized novolak and at least one brominated bisphenol, in combination with a polyphenylene ether and further components including specific catalysts and hardeners, may be used in the preparation of laminates useful as printed circuit boards and having excellent physical and electrical properties.

17 Claims, No Drawings

CURABLE POLYPHENYLENE ETHER-POLYEPOXIDE COMPOSITIONS USEFUL IN PRINTED CIRCUIT BOARD PRODUCTION

This invention relates to resinous compositions useful as dielectrics, and more particularly to polyphenylene ether-polyepoxide compositions suitable for fabrication into printed circuit boards.

A number of polyphenylene ether-polyepoxide compositions having favorable dielectric properties, and supposedly being useful in circuit board manufacture, are known. However, for the most part these have not attained wide commercial use because of deficiencies in one or more properties. Thus, while the polyphenylene ethers are excellent dielectrics and the properties of combinations thereof with polyepoxides are favorable in this respect, they lack solvent resistance which is required in order for the circit board to survive cleaning with such solvents as methylene chloride. Other deficiencies are found in areas such as flammability, solderability and resistance to high temperatures. Moreover, times required for curing such compositions are typically too long for effective manufacture of circuit boards in large volume.

In addition to excellent dielectric properties, resinous compositions to be used for printed circuit board manufacture should be highly flame-retardant. A V-1 rating, as determined by Underwriters Laboratories test procedure UL-94, is universally required with V-0 usually being necessary. The V-0 rating requires a flame-out time (FOT) of not more than 10 seconds in any trial and a cumulative FOT of not more than 50 seconds for five samples. As a practical matter, a maximum cumulative FOT of 35 seconds is often mandated by purchasers.

The fabricated board should not lose substantial weight and its surface should not be appreciably marred by contact with methylene chloride. Solderability should be good, as evidenced by the lowest possible percent increase in thickness (Z-axis expansion) of the board when exposed to liquid solder at 288° C. In addition to all these properties of the cured material, a relatively short curing time is highly desirable.

Copending, commonly owned application Ser. No. 92,725, filed Sept. 3, 1987 (Now abandoned and a parent of application Ser. No. 07/287,604) discloses polyphenylene ether-polyepoxide composition which are curable by a zinc or aluminum salt of a diketone such as acetylacetone, optionally in the presence of a phenolic compound or basic nitrogen compound as a curing accelerator. While these compositions have excellent dielectric properties and solder and solvent resistance, there is room for improvement in flame retardancy and curing time.

In Japanese Kokai No. 58/69052, combinations of polyphenylene ethers with various types of polyepoxides are disclosed. The latter include epoxy novolak resins and polyglycidyl ethers of such compounds as bisphenol A and 3,5,3',5'-tetrabromobisphenol A. Curing of these compositions is achieved by contact with various known curing agents, including amines. The cured compositions, however, have been found to be seriously deficient in solvent resistance and, in certain cases, in solderability.

The present invention provides a series of resinous compositions which comprise polyepoxides, polyphenylene ethers and various catalysts, hardeners, flame retardants and other constituents. When used to impregnate suitable fibrous reinforcing materials such as glass fiber cloth, they furnish workable prepregs. Said compositions are readily soluble in organic solvents, facilitating impregnation. The cured materials prepared therefrom are highly solder resistant, solvent resistant and flame retardant, and have excellent dielectric properties and dimensional stability at high temperatures. Therefore, said cured materials are excellent when employed as laminates for printed circuit boards.

In one of its aspects, the invention includes curable compositions containing chemically combined bromine in an amount effective to impart flame retardancy and comprising:

(I) about 25–50% of a resinous composition containing 15–20% chemically combined bromine and comprising the reaction product obtained by heating, in the presence of a catalytic amount of at least one basic reagent, a mixture comprising:

(A) at least one halogen-free bisphenol polyglycidyl ether having an average of at most one aliphatic hydroxy group per molecule;

(B) about 15–25% of at least one halogen-free epoxidized novolak; and (C) 25–35% of at lest one bisphenol containing bromine as aryl substituents;

the percentages of components B and C being based on total reagents A, B and C;

(II) about 35–55% of at least one polyphenylene ether;

(III) about 4–15% of at least one halogen-free novolak, substantially all oxygen therein being in the form of phenolic hydroxy groups;

(IV) an amount of at least one of imidazoles and arylene polyamines to provide a total of at least 4.5 milliequivalents of basic nitrogen per 100 parts of said curable composition;

(V) about 0.1–1.0% of zinc in the form of a zinc salt which is soluble or stably dispersible in said curable composition; and (VI) about 1–4% of antimony pentoxide stably dispersed in said curable composition;

said composition being dissolved in an effective amount of an inert organic solvent;

said percentages being by weight and based on the total of components I–VI and any other resinous materials and brominated materials present.

Component I in the compositions of this invention is prepared by the reaction of two or three reagents of which reagent A is at least one halogen-free bisphenol polyglycidyl ether. The most common compounds of this type are prepared by the reaction of bisphenols with epichlorohydrin. (By "bisphenol" as used herein is meant a compound containing two hydroxyphenyl groups attached to an aliphatic or cycloaliphatic moiety, which may also contain aromatic substituents.) Said compounds may be represented by the formula

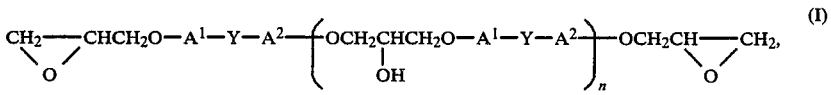

wherein n has an average value up to 1, each of $A^1$ and $A^2$ is a monocyclic divalent aromatic radical and Y is a bridging radical in which one or two atoms separate $A^1$ from $A^2$. The $O-A^1$ and $A^2$-bonds in formula I are usually in the meta or para positions of $A^1$ and $A^2$ in relation to Y.

In formula I, the $A^1$ and $A^2$ values may be unsubstituted phenylene or substituted derivatives thereof, illustrative substituents (one or more) being alkyl, nitro, alkoxy and the like. Unsubstituted phenylene radicals are preferred. Each of $A^1$ and $A^2$ may for example. be o- or m-phenylene and the other p-phenylene but both are preferably p-phenylene.

The bridging radical, Y, is one in which one or two atoms, preferably one, separate $A^1$ from $A^2$. It is most often a hydrocarbon radical and particularly a saturated radical such as methylene, cyclohexylmethylene, ethylene, isopropylidene, neopentylidene, cyclohexylidene or cyclopentadecylidene, especially a gem-alkylene (alkylidene) radical and most preferably isopropylidene. Also included, however, are radicals which contain atoms other than carbon and hydrogen; for example, carbonyl, oxy, thio, sulfoxy and sulfone.

The materials which are preferred as reagent A are commercially available reaction products of epichlorohydrin and 2,2-bis(4-hydroxyphenyl)propane (bisphenol A), including EPON 825 (n=0) and EPON 828 (n=about 0.14), available from Shell Chemical Co.

Reagent B is at least one halogen-free epoxidized novolak. Suitable novolaks for use as precursors therefor are known in the art and are typically prepared by the reaction of formaldehyde with a hydroxyaromatic compound such as phenol (which is often preferred), cresol or t-butylphenol. The novolak then undergoes reaction with an epoxy reagent such as epichlorohydrin to produce the resin useful as reagent B.

Various epoxidized novolaks are commercially available, and any of them may be used according to the invention. It is usually strongly preferred that the epoxidized novolak contain substantially no free phenolic hydrogen atoms.

Reagent C is at least one bisphenol containing bromine in the form of substituents or the aromatic rings, usually a brominated derivative of bisphenol A. Its purpose according to the invention is principally to provide flame retardancy. 2,2-Bis(3,5-dibromo-4-hydroxyphenyl)propane is preferred as reagent C because of its availability, relatively low cost and particular suitability for the purposes of the invention.

As previously mentioned, reagent B comprises about 15-25% and reagent C 25-35% of the composition comprising component I, with the balance being reagent A. Lower concentrations of reagent B or reagent C cause an unacceptable decrease in solvent resistance and/or flame resistance. An increase in reagent C may yield an incompatible material. The preferred proportion of reagent C is in the range of 28-32%.

The mixture comprising reagents A, B and C is heated, most often at a temperature in the range of about 125°-225° C., preferably about 150°-200° C. and most preferably about 160°-190° C., in the presence of a catalytic amount of at least one basic reagent. Said mixture preferably consists essentially of said reagents; that is, they are the only ones contributing to the novel and essential properties thereof.

The triarylphosphines, especially triphenylphosphine, are the preferred basic reagents by reason of their effectiveness at low levels, low tendency to cause side reactions and harmlessness when they remain present after the reaction is complete. The proportion of catalyst is typically about 0.1-0.5% by weight. The reaction is preferably conducted in an inert atmosphere such as nitrogen, especially when a triarylphosphine is employed as catalyst. An inert organic solvent having a boiling point no higher than about 125° C., usually an aromatic hydrocarbon such as toluene, may be employed but usually provides no advantage at this point.

The structure of the resinous composition thus obtained is not fully known. It is believed to be an "upstaged" (i.e., partially cured) composition derived from the compounds of formula I, in which the brominated moieties form part of the molecular structure. The epoxidized novolak may also be chemically bound into the molecules of the upstaged composition in varying proportions.

The preparation of the upstaged compositions is illustrated by the following example.

EXAMPLE 1

A mixture of 50 parts by weight of bisphenol A diglycidyl ether, 30 parts of 2,2-bis(3,5-dibromo-4-hydroxyphenyl)propane, 20 parts of an epoxy novolak resin commercially available from Ciba-Geigy under the grade designation "EPN 1138" and 0.2 part of triphenylphosphine was heated at 165° C. for one hour in a nitrogen atmosphere, with stirring. The product was the desired upstaged composition and contained 17.6% bromine.

For the preparation of curable compositions useful in the manufacture of printed circuit boards having the desired properties, component I is combined with the other materials enumerated above. In particular, intermediates which may be employed in the preparation of such compositions include resinous blends containing 5-10% chemically combined bromine and comprising about 35-60% of component I and about 40-65% of component II, said percentages being by weight of total resinous components. These resinous blends and the above-described upstaged compositions are disclosed and claimed in copending, commonly owned application Ser. No. [RD-18473].

The polyphenylene ethers useful as component II comprise a plurality of structural units having the formula

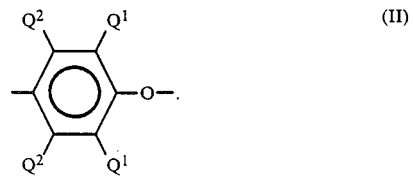

In each of said units independently, each $Q^1$ is independently halogen, primary or secondary lower alkyl (i.e., alkyl containing up to 7 carbon atoms), phenyl, haloalkyl, aminoalkyl, hydrocarbonoxy, or halohydrocarbonoxy wherein at least two carbon atoms separate the halogen and oxygen atoms; and each $Q^2$ is independently hydrogen, halogen, primary or secondary lower alkyl, phenyl, haloalkyl, hydrocarbonoxy or halohydrocarbonoxy as defined for $Q^1$. Examples of suitable primary lower alkyl groups are methyl, ethyl, n-propyl, n-butyl, isobutyl, n-amyl, isoamyl, 2-methylbutyl, n-hexyl, 2,3-dimethylbutyl, 2-, 3- or 4-methylpentyl and the corresponding heptyl groups. Examples of secondary lower alkyl groups are isopropyl, sec-butyl and 3-pentyl. Preferably, any alkyl radicals are straight chain rather than branched. Most often, each $Q^1$ is alkyl or phenyl, especially $C_{1-4}$ alkyl, and each $Q^2$ is hydrogen. Suitable polyphenylene ethers are disclosed in a large number of patents.

Both homopolymer and copolymer polyphenylene ethers are included. Suitable homopolymers are those containing, for example, 2,6-dimethyl-1,4-phenylene ether units. Suitable copolymers include random copolymers containing such units in combination with (for example) 2,3,6-trimethyl- 1,4-phenylene ether units. Many suitable random copolymers, as well as homopolymers, are disclosed in the patent literature.

Also included are polyphenylene ethers containing moieties which modify such properties such as molecular weight, melt viscosity and/or impact strength. Such polymers are described in the patent literature and may be prepared by grafting onto the polyphenylene ether in known manner such non-hydroxy-containing vinyl monomers as acrylonitrile and vinylaromatic compounds (e.g., styrene), or such non-hydroxy-containing polymers as polystyrenes and elastomers. The product typically contains both grafted and ungrafted moieties. Other suitable polymers are the coupled polyphenylene ethers in which the coupling agent is reacted in known manner with the hydroxy groups of two polyphenylene ether chains to produce a higher molecular weight polymer containing the reaction product of the hydroxy groups and the coupling agent. Illustrative coupling agents are low molecular weight polycarbonates, quinones, heterocycles and formals.

For the purposes of this invention, the polyphenylene ether has a number average molecular weight within the range of about 3,000–40,000, preferably at least about 12,000 and most preferably at least about 15,000, and a weight average molecular weight within the range of about 20,000–80,000, as determined by gel permeation chromatography. Its intrinsic viscosity is most often in the range of about 0.35–0.6 dl./g., as measured in chloroform at 25° C.

The polyphenylene ethers are typically prepared by the oxidative coupling of at least one corresponding monohydroxyaromatic compound. Particularly useful and readily available monohydroxyaromatic compounds are 2,6-xylenol (wherein each $Q^1$ is methyl and each $Q^2$ is hydrogen), whereupon the polymer may be characterized as a poly(2,6-dimethyl-1,4-phenylene ether), and 2,3,6-trimethylphenol (wherein each $Q^1$ and one $Q^2$ is methyl and the other $Q^2$ is hydrogen).

A variety of catalyst systems are known for the preparation of polyphenylene ethers by oxidative coupling. There is no particular limitation as to catalyst choice and any of the known catalysts can be used. For the most part, they contain at least one heavy metal compound such as a copper, manganese or cobalt compound, usually in combination with various other materials.

A first class of preferred catalyst systems consists of those containing a copper compound. Such catalysts are disclosed, for example, in U.S. Pat. Nos. 3,306,874, 3,306,875, 3,914,266 and 4,028,341. They are usually combinations of cuprous or cupric ions, halide (i.e., chloride, bromide or iodide) ions and at least one amine.

Catalyst systems containing manganese compounds constitute a second preferred class. They are generally alkaline systems in which divalent manganese is combined with such anions as halide, alkoxide or phenoxide. Most often, the manganese is present as a complex with one or more complexing and/or chelating agents such as dialkylamines, alkanolamines, alkylenediamines, o-hydroxyaromatic aldehydes, o-hydroxyazo compounds, ω-hydroxyoximes (monomeric and polymeric), o-hydroxyaryl oximes and β-diketones. Also useful are known cobalt-containing catalyst systems. Suitable manganese and cobalt-containing catalyst systems for polyphenylene ether preparation are known in the art by reason of disclosure in numerous patents and publications.

Particularly useful polyphenylene ethers for the purposes of this invention are those which comprise molecules having at least one of the end groups of the formulas

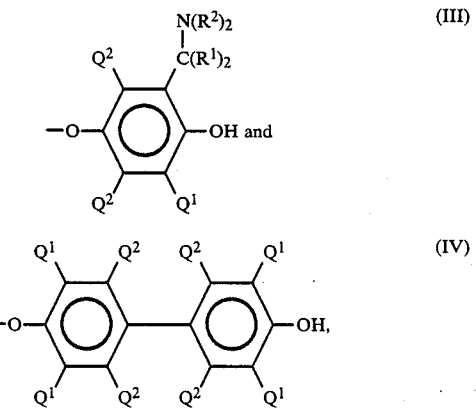

wherein $Q^1$ and $Q^2$ are as previously defined; each $R^1$ is independently hydrogen or alkyl, with the proviso that the total number of carbon atoms in both $R^1$ radicals is 6 or less; and each $R^2$ is independently hydrogen or a $C_{1-6}$ primary alkyl radical. Preferably, each $R^1$ is hydrogen and each $R^2$ is alkyl, especially methyl or n-butyl.

Polymers containing the aminoalkyl-substituted end groups of formula III may be obtained by incorporating an appropriate primary or secondary monoamine as one of the constituents of the oxidative coupling reaction mixture, especially when a copper- or manganese-containing catalyst is used. Such amines, especially the dialkylamines and preferably di-n-butylamine and dimethylamine, frequently become chemically bound to the polyphenylene ether, most often by replacing one of the α-hydrogen atoms on one or more $Q^1$ radicals. The principal site of reaction is the $Q^1$ radical adjacent to the hydroxy group on the terminal unit of the polymer chain. During further processing and/or blending, the aminoalkyl-substituted end groups may undergo various reactions, probably involving a quninone methide-type intermediate of the formula

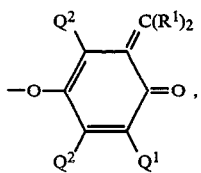
(V)

with numerous beneficial effects often including an increase in impact strength and compatibilization with other blend components. Reference is made to U.S. Pat. Nos. 4,054,553, 4,092,294, 4,477,649, 4,477,651 and 4,517,341, the disclosures of which are incorporated by reference herein.

Polymers with 4-hydroxybiphenyl end groups of formula IV are typically obtained form reaction mixtures in which a by-product diphenoquinone of the formula

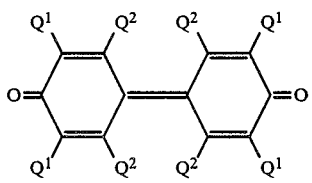
(VI)

is present, especially in a copper-halide-secondary or tertiary amine system. In this regard, the disclosure of U.S. Pat. No. 4,477,649 is again pertinent as are those of U.S. Pat. Nos. 4,234,706 and 4,482,697, which are also incorporated by reference herein. In mixtures of this type, the diphenonquinone is ultimately incorporated into the polymer in substantial proportions, largely as an end group.

In many polyphenylene ethers obtained under the above-described conditions, a substantial proportion of the polymer molecules, typically constituting as much as about 90% by weight of the polymer, contain end groups having one or frequently both of formulas III and IV. It should be understood, however, that other end groups may be present and that the invention in its broadest sense may not be dependent on the molecular structures of the polyphenylene ether end groups.

It will be apparent to those skilled in the art from the foregoing that the polyphenylene ethers contemplated for use in the present invention include all those presently known, irrespective of variations in structural units or ancillary chemical features.

In addition to the polyphenylene ether and the upstaged composition, the curable compositions of this invention and the above-described resinous blends preferably contain (VII) at least one polyepoxy compound selected from those described hereinabove with reference to reagents A and B. Said polyepoxy compound acts to improve the solvent resistance of the cured compositions described hereinafter. The epoxidized novolaks (reagent B) are usually preferred by reason of their high solubility in the solvents ordinarily employed as described hereinafter. Curable compositions which do not contain component VII are within the scope of the invention but are generally not preferred.

The resinous blends contain about 35-60% of component I and about 40-65% of component II. When component VII is present, it comprises an amount up to about 10% of the resinous blend and, in that case, also of the curable compositions of the invention. All of said percentages are based on the total resinous components in said blend. The preferred proportions are about 35-45% of component I, about 50-60% of component II and about 4-8% of component VII. The blends also contain 5-10%, preferably 6-9%, of chemically combined bromine supplied, at least in part, by component I. The foregoing percentages are exclusive of any solvent which may be present.

Component III is at least one novolak in which substantially all oxygen is in the form of phenolic hydroxy groups. Thus, it is similar in molecular structure to the previously described epoxidized novolak except that it has not been epoxidized. t-Butylphenol-formaldehyde novolaks are often preferred.

Component IV is at least one compound selected from the group consisting of imidazoles and arylene polyamines. Any of such imidazoles and polyamines known in the art to be useful as curing agents for epoxy resins may be employed. Particularly useful imidazoles are imidazole, 1,2-dimethylimidazole, 2-methylimidazole, 2-heptadecylimidazole and 1-(2-cyanoethyl)-2-phenylimidazole. Commercially available imidazole-arylene polyamine mixtures are often preferred; the especially preferred mixtures contain arylene polyamines with a high degree of alkyl substitution on the aromatic ring, typically at least 3 such substituents. The diethylmethyl-substituted m- and p-phenylenediamines are generally the most preferred polyamines.

The amount of component IV is selected to achieve rapid cure after solvent removal. This requires at least 2 and preferably at least 4.5 milliquivalents of basic nitrogen per 100 parts of the curable composition, including any basic nitrogen present in the polyphenylene ether (mostly as end groups of formula III). Thus, when a polyphenylene ether essentially free from basic nitrogen is employed the proportion of component IV must be increased. (For the purpose of this invention, the equivalent weight of an imidazole is equal to its molecular weight and that of a diamine is half its molecular weight.)

Component V is chemically combined zinc, furnished in the form of a zinc salt which is soluble or stably dispersible in the curable composition. Zinc salts of diketones in which one carbon atom separates the carbonyl groups, especially zinc acetylacetonate, and zinc salts of fatty acids, especially zinc stearate, are examples of suitable forms of zinc for this purpose. In general, the fatty acid salts are preferred when component IV contains arylene polyamines, and diketone salts are preferred when component IV is entirely imidazole.

Under certain conditions, zinc bis(acetylacetonate) can form a hydrate which readily loses acetylacetone and becomes insoluble in the organic systems used for laminate preparation. Therefore, it may be necessary to take steps to maintain the zinc in stable dispersion.

One means for doing this is to subject the composition to continuous agitation; however, this is generally not practical. A better method is to form an alcoholate of the zinc acetylacetonate, as by reaction with methanol. Said alcoholate loses alcohol rather than acetylacetone under similar conditions, remaining in solution or homogeneous suspension.

Another method for maximizing homogeneity is to employ a zinc fatty acid salt. Still another method is to employ a titanium compound as a compatibilizer, as disclosed hereinafter.

Component VI is antimony pentoxide, which must also be maintained in stable dispersion. This may be done by agitation and/or combination with a suitable dispersing agent, of which many are known in the art.

One preferred dispersing agent is a polymer which is compatible with the resinous constituents of the curable composition but is substantially non-reactive under the conditions employed, typically a polyester. More powerful dispersing agents, such as amines, may be required when component V is a fatty acid zinc salt, since such salts may otherwise form insoluble complexes with antimony pentoxide.

The curable compositions of the invention are dissolved in an effective amount of an inert organic solvent, typically to a solute content of about 30–60%, by weight. The identity of the solvent is not critical, provided it may be removed by suitable means such as evaporation. Aromatic hydrocarbons, especially toluene, are preferred. The order of blending and dissolution is also not critical. Most often all components are initially dissolved therein, but proportions of components and bromine are in terms of components I–V and other resinous materials (including component VII, if present) and brominated materials, and do not include solvent.

In the curable compositions, component III serves as a hardener and component IV as a curing catalyst. Component V has cocatalytic properties and accelerates curing; it also serves to improve solvent resistance and flame retardancy. Component VI functions as a synergist for the bromine to improve flame retardancy. If it is absent, the proportion of bromine compound required to provide V-0 flame retardancy is much higher, typically about 12%, and the only way to avoid incompatibility of the bromine compound is to use more expensive bromine sources.

The broad ranges of proportions of bromine and components I–VII in the curable compositions of the invention are described hereinabove. The most preferred proportions are:

| | |
|---|---|
| Bromine | 6–9%; |
| Component I | about 30–40%; |
| Component II | about 40–50%; |
| Component III | about 4–8%; |
| Component IV | about 5–10 milliequivalents of basic nitrogen; |
| Component V | about 0.1–0.6% of zinc; |
| Component VI | about 1–3% of antimony pentoxide; |
| Component VII | about 4.2–4.8%. |

Other materials may also be present. These include inert, particulate fillers such as talc, clay, mica, silica, alumina and calcium carbonate. In addition, the bromine content of the curable composition may be supplied in part by materials such as alkyl tetraromophthalates and/or epichlorohydrin reaction products with mixtures of bisphenol A and tetrabromobisphenol A. The alkyl tetrabromophthalates also serve as platicizers and flow improvers. Such materials as antioxidants, thermal and ultraviolet stabilizers, lubricants, anti-static agents, dyes and pigments may also be present.

A material whose presence in minor amount may improve the solvent resistance and compatability of the curable composition, and is therefore preferred, is at least one aliphatic tri(dialkylphosphato)titanate. Suitable phosphatotitanates are known in the art and commercially available. They may be represented by the formula

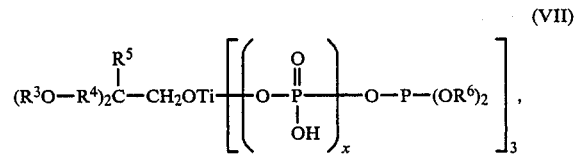

wherein $R^3$ is $C_{2-6}$ primary or secondary alkyl or alkenyl and preferably alkenyl, $R^4$ is $C_{1-3}$ alkylene and preferably methylene, $R^5$ is $C_{1-5}$ primary or secondary alkyl, $R^6$ is $C_{5-12}$ primary or secondary alkyl and x is from 0 to about 3 and is preferably 0 or 1. Most preferably, $R^3$ is allyl, $R^5$ is ethyl, $R^6$ is octyl and x is 0. The phosphatotitanate is most often present in the amount of about 0.1–1.0 part by weight per 100 parts of the resinous composition.

Another aspect of the invention is prepregs comprising a fibrous substrate (woven or non-woven) such as glass, quartz, polyester, polyamide, polypropylene, cellulose, nylon or acrylic fibers, preferably glass, impregnated with the curable composition and obtained upon removal of the solvent therefrom by evaporation or the like. As used herein, "prepreg" means a curable article comprising a substrate impregnated with an uncured or partially cured resinous material. Such prepregs may be cured by application of heat and pressure. The resulting cured articles are other aspects of the invention.

Typically, 2- to 20-ply prepreg laminates are compression molded at temperatures in the range of about 200°–250° C. and under pressures on the order of 20–60 kg./cm.². Laminates clad with a conductive metal such as copper, useful for printed circuit board production, may be so prepared and cured by art-recognized methods. As previously mentioned, printed circuit board blanks comprising said laminates are characterized by excellent dielectric properties, solderability, flame retardancy and resistance to high temperature conditions and solvents. The metal cladding may then be conventionally patterned.

The preparation of the curable compositions, cured compositions and laminates of this invention is illustrated by the following examples. All parts and percentages are by weight unless otherwise indicated.

In Examples 2–9, the following ingredients were employed:

Component I—the product of Example 1.

Component II—a poly(2,6-dimethyl-1,4-phenylene ether) having a number average molecular weight of about 20,000, an intrinsic viscosity in chloroform at 25° C. of 0.40 dl./g. and a nitrogen content of about 960 ppm.

Component III—a commercially available t-butylphenol novolak having an average molecular weight in the range of about 700–900.

Component IV:
Imidazole-amine mixture—a mixture of 1,2-dimethylimidazole and isomers of diethylmethylphenylenediamine, having an average equivalent weight of about 91.

Component V—zinc acetylacetonate or zinc stearate.

Component VI:
APE 1540—a commercially available colloidal dispersion comprising about 40% antimony pentoxide in a polyester resin derived predominantly from isophthalic acid.

ADP-480—a commercially available colloidal dispersion comprising about 75% antimony pentoxide coated with an amine powder and dispersed in toluene.

Component VII—the bisphenol A diglycidyl ether and the "EPN 1138" of Example 1.

EXAMPLES 2-8

A series of curable varnish compositions was prepared by dissolution of the ingredients in toluene to a total solids concentration of 35-40%. The compositional data for said varnish compositions are given in Table I. Except for phosphatotitanate and basic nitrogen, all units are percent by weight.

TABLE I

| | Example | | | | | | |
|---|---|---|---|---|---|---|---|
| | 2 | 3 | 4 | 5 | 6 | 7 | 8 |
| Component I | 29.38 | 37.09 | 32.31 | 27.33 | 26.81 | 35.65 | 36.46 |
| Component II | 45.70 | 37.53 | 40.34 | 45.55 | 44.69 | 44.57 | 45.58 |
| Component III | 5.01 | 4.26 | 8.07 | 4.56 | 4.47 | 8.92 | 9.12 |
| Component IV: | | | | | | | |
| 2-heptadecylimidazole | 0.87 | 0.70 | — | 0.73 | 0.72 | — | — |
| Imidazole-amine mixture | — | — | 0.56 | — | — | 0.62 | 0.64 |
| Component V: | | | | | | | |
| Zinc bis(acetylacetonate) | 2.07 | 1.71 | 1.62 | 1.56 | 1.53 | — | — |
| Zinc stearate | — | — | 1.61 | — | — | 1.78 | 1.82 |
| Component VI: | | | | | | | |
| APE 1540 | 7.18 | 7.16 | 6.94 | — | — | — | — |
| ADP 480 | — | — | — | 3.97 | 3.90 | 4.01 | 1.82 |
| Component VII: | | | | | | | |
| EPN 1138 | — | — | 4.03 | 4.56 | 4.47 | 4.45 | 4.56 |
| Bisphenol A diglycidyl ether | 5.44 | 7.21 | — | — | — | — | — |
| DOTBP | 4.35 | 4.34 | 4.52 | 2.63 | — | — | — |
| Brominated epoxy | — | — | — | 9.11 | — | — | — |
| Phosphatotitanate, parts/100 parts resinous component | 0.50 | 0.41 | 0.40 | 0.47 | 0.46 | 0.45 | 0.46 |
| Bromine | 6.98 | 8.33 | 7.57 | 7.80 | 7.50 | 6.26 | 6.20 |
| Zinc | 0.51 | 0.42 | 0.57 | 0.39 | 0.38 | 0.18 | 0.19 |
| Antimony pentoxide | 2.9 | 2.9 | 2.8 | 3.0 | 2.9 | 3.0 | 1.37 |
| Basic nitrogen, meq./100 parts | 5.9 | 4.9 | 9.0 | 5.5 | 5.4 | 9.9 | 10.1 |

Additional components:

DOTBP—dioctyl tetrabromophthalate.

Brominated epoxy—a product prepared by the reaction of a mixture of bipshenol A and 2,2-bis(3,5-dibromo-4-hydroxyphenyl)propane with epichlorohydrin, containing about 21% bromine.

Phosphatotitanate—a commercially available compound of formula VII wherein $R^3$ is allyl, $R^4$ is methylene, $R^5$ is ethyl, $R^6$ is octyl and x is 0.

Swatches of electrical grade woven fiberglass cloth were dipped into the varnishes of Examples 2-7 and air dried at elevated temperature to remove solvent and yield composite prepregs. Copper-clad laminates were then prepared from 1-oz. copper foil and 8 plies of the prepregs by compression molding for 5-10 minutes at 230° C. and 49.2 kg./cm.$^2$. Said laminates were evaluated for flame retardancy in accordance with Underwriters Laboratories procedure UL-94. Those prepared from the compositions of Examples 6 and 7 were also evaluated according to various test procedures which form part of military specification MIL-P-13949. The results are given in Table II.

TABLE II

| | Example | | | | | |
|---|---|---|---|---|---|---|
| | 2 | 3 | 4 | 5 | 6 | 7 |
| Laminat thickness (less copper), mm. | 1.42 | 1.40 | 1.50 | 1.56 | 1.52 | 1.57 |
| Resin content, % | — | — | — | — | 37 | 57 |
| UL-94: | | | | | | |
| FOT, total sec./5 samples | 25 | 27 | 19 | 27 | 30 | 29 |
| Rating | V-O | V-O | V-O | V-O | V-O | V-O |
| Water absorption (24 hrs. soak at 23° C.), % | — | — | — | — | 0.06 | 0.07 |
| Flexural strength, MPa.: | | | | | | |
| Longitudinal | — | — | — | — | 606.7 | — |
| Cross-sectional | — | — | — | — | 379.2 | — |
| Flexural modulus, GPa.: | | | | | | |
| Longitudinal | — | — | — | — | 22.1 | — |
| Cross-sectional | — | — | — | — | 19.3 | — |
| Izod Impact strength, joules/m.: | | | | | | |
| Longitiudinal | — | — | — | — | NB* | — |
| Cross-sectional | — | — | — | — | 671 | — |
| Dielectric constant at 1 MHz.: | | | | | | |
| Untreated | — | — | — | — | 4.19 | 3.70 |
| After 24 hrs. In water at 23° C. | — | — | — | — | 4.24 | 3.75 |
| Dissipation factor 1 MHz.: | | | | | | |
| Untreated | — | — | — | — | 0.011 | 0.13 |

TABLE II-continued

| | Example | | | | | |
|---|---|---|---|---|---|---|
| | 2 | 3 | 4 | 5 | 6 | 7 |
| After 24 hrs. In water at 23° C. | — | — | — | — | 0.012 | 0.16 |
| Parallel dielectric breakdown strength, kv.: | | | | | | |
| Short time | | | | | | |
| Untreated | — | — | — | — | 76 | — |
| After 48 hrs. In water at 50° C. | — | — | — | — | 78 | 79 |
| Step by step | | | | | | |
| Untreated | — | — | — | — | 73 | — |
| After 48 hrs. In water 50° C. | — | — | — | — | 64 | 72 |
| Perpendicular dielectric breakdown strength, volts/mil: | | | | | | |
| Untreated | — | — | — | — | 767 | 803 |
| After 48 hrs. In water at 50° C. | — | — | — | — | 783 | — |
| Peel strength, kg./cm. | — | — | — | — | >1.4 | >1.4 |
| Methylene chloride resistance, % absorbed | — | — | — | — | 0 | 1.44 |

*No break.

EXAMPLE 9

A 75% solution in toluene of the upstaged composition of Example 1 was prepared and 640 parts thereof (component I) was combined with 2252 parts of hot toluene, 600 parts of component II, 120 parts of component III, 10.2 parts of 2-heptadecylimidazole (component IV), 24 parts of zinc acetylacetonate (component V), 42 parts of ADP-480 (component VI), 60 parts of "EPN 1138" (component VII) and 6 parts of phosphatotitanate, to prepare a curable varnish containing 7.5% bromine, 0.45% zinc, 2.4% antimony pentoxide and 5.5 milliequivalents of basic nitrogen per 100 parts. Swatches of electrical grade woven fiberglass cloth were dipped into said varnish and air dried at elevated temperature to remove solvent and yield composite prepregs. Copper-clad laminates were then prepared from 10 plies of the prepregs by compression molding for 10 minutes at 240° C. and 28.1 kg./cm.$^2$.

The laminates were subjected to physical testing in comparison with the following controls, based on the disclosure of Japanese Kokai No. 58/69052:

Control A—identical to Example 9 except that an upstaged composition prepared from 66.7 parts of bisphenol A diglycidyl ether and 33.3 parts of 2,2-bis(3,5-dibromo-4-hydroxyphenyl)propane was employed and the phosphatotitanate was omitted.

Control B—a curable composition was prepared from 600 parts of polyphenylene ether, 400 parts of bisphenol A diglycidyl ether, 73 parts of m-phenylenediamine, 1 part of triethylamine hydrochloride and 2252 parts of toluene; a 10-ply laminate was molded at 200° C. and 28.1 kg./cm.$^2$ for one hour. The procedure was essentially that of Example 2 of the Japanese Kokai.

The test results are given in Table III.

TABLE III

| | Invention | Control A | Control B |
|---|---|---|---|
| Glass transition temperature, °C. | 221 | 220 | 190 |
| Methylene chloride resistance, % absorbed | 0 | 10 | 0 |
| Appearance after methylene chloride immersion | Good | Severe erosion | Severe whitening |
| Z-axis expansion, % | 1.3 | 4.1 | 3.4 |

It is apparent that the phosphatotitanate-containing compositions of this invention afford laminates with properties superior to those of laminates prepared according to the Japanese Kokai.

What is claimed is:

1. A curable composition containing chemically combined bromine in an amount effective to impart flame retardancy and comprising:
   (I) about 25-50% of a resinous composition containing 15-20% chemically combined bromine and comprising the reaction product obtained by heating at a temperature in the range of about 125°-225° C., in the presence of a catalytic amount of at least one basic reagent, a mixture comprising:
      (A) at least one halogen-free bisphenol polyglycidyl ether having an average of at most one aliphatic hydroxy group per molecule;
      (B) about 15-25% of at least one halogen-free epoxidized novolak; and
      (C) 25-35% of at least one bisphenol containing bromine as aryl substituents;
   the percentages of components B and C being based on total reagents A, B and C;
   (II) about 35-55% of at least one polyphenylene ether;
   (III) about 4-15% of at least one halogen-free noyolak, substantially all oxygen therein being in the form of phenolic hydroxy groups;
   (IV) an amount of at least one of imidazoles and arylene polyamines to provide a total of at least 2 milliequivalents of basic nitrogen per 100 parts of said curable composition;
   (V) about 0.1-1.0% of zinc in the form of a zinc salt which is soluble or stably dispersible in said curable composition; and
   (VI) about 1-4% of antimony pentoxide stably dispersed in said curable composition;
   said composition being dissolved in an effective amount of an inert organic solvent;
   said percentages being by weight and based on the total of components I-VI and any other resinous materials and brominated materials present.

2. A curable composition containing chemically combined bromine in an amount effective to impart flame retardancy and comprising:
   (I) about 25-50% of a resinous composition containing 15-20% chemically combined bromine and comprising the reaction product obtained by heating at a temperature in the range of about 125°-225° C., in the presence of a catalytic amount of at least one basic reagent, a mixture consisting essentially of:
(A) at least one halogen-free bisphenol polyglycidyl ether having an average of at most one aliphatic hydroxy group per molecule;
(B) about 15–25% of at least one halogen-free epoxidized novolak; and
(C) 25–35% of at least one bisphenol containing bromine as aryl substituents;
the percentages of components B and C being based on total reagents A, B and C;
(II) about 35–55% of at least one polyphenylene ether;
(III) about 4–15% of at least one halogen-free novolak, substantially all oxygen therein being in the form of phenolic hydroxy groups;
(IV) an amount of at least one of imidazoles and arylene polyamines to provide a total of at least 2 milliequivalents of basic nitrogen per 100 parts of said curable composition;
(V) about 0.1–1.0% of zinc in the form of a zinc salt which is soluble or stably dispersible in said curable composition; and
(VI) about 1–4% of antimony pentoxide stably dispersed in said curable composition;
said composition being dissolved in an effective amount of an inert organic solvent;
said percentages being by weight and based on the total of components I–VI and any other resinous materials and brominated materials present.

3. A composition according to claim 2 wherein reagent A has the formula

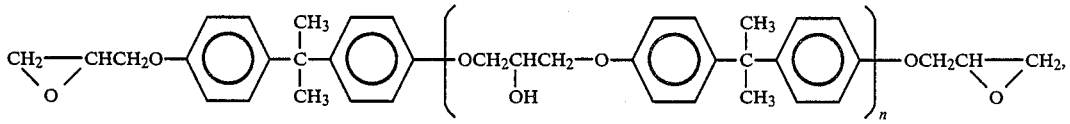

wherein n has an average value up to 1; reagent B is a novolak prepared from formaldehyde, phenol and epichlorohydrin and reagent C is 2,2-bis(3,5-dibromo-4-hydroxyphenyl)propane; said composition also containing (VII) an amount up to about 10% of at least one polyepoxy compound selected from halogen-free bisphenol polyglycidyl ethers having an average of at most one aliphatic hydroxy group per molecule and halogen-free epoxidized novolaks.

4. A composition according to claim 3 wherein n is 0, component II is a poly(2,6-dimethyl-1,4-phenylene ether) having a number average molecular weight within the range of about 12,000–40,000 and component VII is an epoxidized novolak and is present in the amount of about 4–8%.

5. A composition according to claim 4 wherein the solvent is toluene.

6. A composition according to claim 4 wherein component VII is prepared from phenol, formaldehyde and epichlorohydrin.

7. A composition according to claim 4 wherein component IV is at least one imidazole and provides a total of at least 4.5 milliequivalents of basic nitrogen per 100 parts of said curable composition.

8. A composition according to claim 4 wherein component IV is a mixture of at least one imidazole with at least one arylene polyamine and provides a total of at least 4.5 milliequivalents of basic nitrogen per 100 parts of said curable composition.

9. A composition according to claim 4 wherein component V is zinc acetylacetonate or zinc stearate.

10. A composition according to claim 9 wherein the proportions are:

| | |
|---|---|
| Bromine | 6–9%; |
| Component I | about 30–40%; |
| Component II | about 40–50%; |
| Component III | about 4–8%; |
| Component IV | about 5–10 milliequivalents of basic nitrogen; |
| Component V | about 0.1–0.6% of zinc; |
| Component VI | about 1–3% of antimony pentoxide; |
| Component VII | about 4.2–4.8%. |

11. A composition according to claim 10 wherein the polyphenylene ether comprises molecules having end groups of the formula

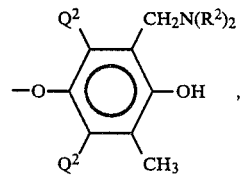

wherein each $R^2$ is independently hydrogen or a $C_{1-6}$ primary alkyl radical.

12. A composition according to claim 11 wherein each $R^2$ is n-butyl.

13. A composition according to claim 4 which also contains at least one aliphatic tris(dialkylphosphato)titanate of the formula

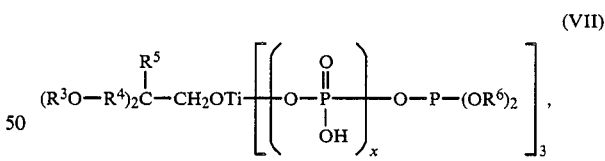

(VII)

wherein $R^3$ is $C_{2-6}$ or secondary alkyl or alkenyl, $R^4$ is $C_{1-3}$ alkylene, $R^5$ is $C_{1-5}$ primary or secondary alkyl, $R^6$ is $C_{5-12}$ primary or secondary alkyl and x is from 0 to about 3, in the amount of about 0.1–1.0 part by weight per 100 parts of the resinous composition.

14. A composition according to claim 13 wherein $R^3$ is alkyl, $R^4$ is methylene, $R^5$ is ethyl, $R^6$ is octyl and x is 0 or 1.

15. A curable composition containing chemically combined bromine in an amount effective to impart flame retardancy and comprising:
(I) about 25–50% of a resinous composition containing 15–20% chemically combined bromine and comprising the product obtained by the reaction, in the presence of a catalytic amount of at least one basic reagent, of:

(A) at least one halogen-free bisphenol polyglycidyl ether having an average of at most one aliphatic hydroxy group per molecule;
(B) about 15–25% of at least one halogen-free epoxidized novolak; and
(C) 25–35% of at least one bisphenol containing bromine as aryl substituents;
the percentages of components B and C being based on total reagents A, B and C;
(II) about 35–55% of at least one polyphenylene ether;
(III) about 4–15% of at least one halogen-free novolak, substantially all oxygen therein being in the form of phenolic hydroxy groups;
(IV) an amount of at least one of imidazoles and arylene polyamines to provide a total of at least 2 milliequivalents of basic nitrogen per 100 parts of said curable composition;
(V) about 0.1–1.0% of zinc in the form of a zinc salt which is soluble or stably dispersible in said curable composition; and
(VI) about 1–4% of antimony pentoxide stably dispersed in said curable composition;
said composition being dissolved in an effective amount of an inert organic solvent;
said percentages being by weight and based on the total of components I–VI and any other resinous materials and brominated materials present.

16. A composition according to claim 15 which also contains (VII) an amount up to about 10% of at least one polyepoxy compound selected from halogen-free bisphenol polyglycidyl ethers having an average of at most one aliphatic hydroxy group per molecule and halogen-free epoxidized novolaks.

17. A composition according to claim 16 which also contains at least one aliphatic tris(dialkylphosphato)titanate of the formula

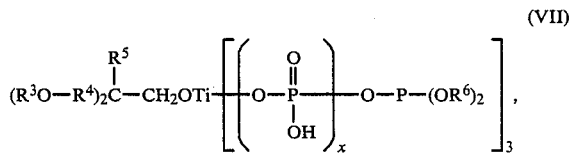

(VII)

wherein $R^3$ is $C_{2-6}$ primary or secondary alkyl or alkenyl, $R^4$ is $C_{1-3}$ alkylene, $R^5$ is $C_{1-5}$ primary or secondary alkyl, $R^6$ is $C_{5-12}$ primary or secondary alkyl and x is from 0 to about 3, in the amount of about 0.1–1.0 part by weight per 100 parts of the resinous composition.

* * * * *

UNITED STATES PATENT AND TRADEMARK OFFICE
CERTIFICATE OF CORRECTION

PATENT NO. : 4,853,423

DATED : August 1, 1989

INVENTOR(S) : Erik W. Walles et al.

It is certified that error appears in the above-identified patent and that said Letters Patent is hereby corrected as shown below:

Column 4, line 56, "[RD-18473]" should read --07/219,102--.

Signed and Sealed this

Thirty-first Day of July, 1990

Attest:

HARRY F. MANBECK, JR.

*Attesting Officer*  *Commissioner of Patents and Trademarks*